United States Patent
He et al.

(10) Patent No.: US 10,485,135 B2
(45) Date of Patent: Nov. 19, 2019

(54) STORAGE DEVICE COOLING UTILIZING A REMOVABLE HEAT PIPE

(71) Applicant: Dell Products, L.P., Round Rock, TX (US)

(72) Inventors: Qinghong He, Austin, TX (US); Travis North, Cedar Park, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 15/639,904

(22) Filed: Jun. 30, 2017

(65) Prior Publication Data

US 2019/0008073 A1    Jan. 3, 2019

(51) Int. Cl.
*H05K 7/20* (2006.01)
*F28D 15/02* (2006.01)
*G06F 1/20* (2006.01)
*H01L 23/427* (2006.01)
*H01L 23/467* (2006.01)

(52) U.S. Cl.
CPC ..... *H05K 7/20145* (2013.01); *F28D 15/0233* (2013.01); *F28D 15/0275* (2013.01); *G06F 1/203* (2013.01); *H01L 23/427* (2013.01); *H01L 23/467* (2013.01); *H05K 7/20172* (2013.01); *H05K 7/20509* (2013.01)

(58) Field of Classification Search
CPC ........................ H05K 7/20145; F28D 15/0275
See application file for complete search history.

(56) References Cited

U.S. PATENT DOCUMENTS

| | | | | |
|---|---|---|---|---|
| 6,301,107 B1* | 10/2001 | Lev | ......................... | G06F 1/203 361/670 |
| 6,407,921 B1* | 6/2002 | Nakamura | .............. | G06F 1/203 165/104.33 |
| 6,504,720 B2* | 1/2003 | Furuya | .................. | H01L 23/427 165/104.33 |
| 6,650,540 B2* | 11/2003 | Ishikawa | ................. | G06F 1/203 165/104.33 |
| 7,474,526 B2* | 1/2009 | Fujiwara | ................. | G06F 1/203 165/104.21 |
| 7,561,417 B2* | 7/2009 | Hung | ................... | F28D 15/0233 165/104.33 |
| 7,589,965 B2* | 9/2009 | Liang | ................. | H05K 7/20154 165/104.33 |
| 8,225,847 B2* | 7/2012 | Li | ......................... | H01L 23/427 165/80.3 |

(Continued)

*Primary Examiner* — Courtney L Smith
(74) *Attorney, Agent, or Firm* — Fogarty LLP

(57) ABSTRACT

A system provides cooling to a storage device, such as solid-state drive, installed within a sealed compartment of an IHS (Information Handling System). The heat pipe extends between the storage device and a fan housing that seals a cooling fan in a physically isolated compartment from the sealed compartment of the IHS. A plurality of clips allow the heat pipe to be removably secured to an outer surface of the fan housing. A cooling plate is used to removably secure the heat pipe to a surface of the storage device. Once installed, the heat pipe transfers heat directly from the surface of the storage device to the outer surface of the sealed fan housing. The heat pipe may be uninstalled by removing screws that secure the cooling plate to the storage device and the heat pipe to the fan housing, allowing the storage device to be removed as needed.

20 Claims, 5 Drawing Sheets

(56) References Cited

U.S. PATENT DOCUMENTS

| | | | |
|---|---|---|---|
| 8,562,291 B2* | 10/2013 | Tan | F04D 29/582 |
| | | | 415/178 |
| 9,971,387 B2* | 5/2018 | Kamimura | G06F 1/20 |
| 2002/0036890 A1* | 3/2002 | Furuya | H01L 23/427 |
| | | | 361/702 |
| 2003/0161102 A1* | 8/2003 | Lee | G06F 1/203 |
| | | | 361/679.48 |
| 2005/0045310 A1* | 3/2005 | Okutsu | F28D 15/0233 |
| | | | 165/80.3 |
| 2007/0279868 A1* | 12/2007 | Tanaka | G06F 1/203 |
| | | | 361/702 |
| 2010/0307719 A1* | 12/2010 | Yang | H01L 23/427 |
| | | | 165/104.26 |
| 2010/0321888 A1* | 12/2010 | Yamaguchi | F28D 15/0275 |
| | | | 361/695 |
| 2011/0249400 A1* | 10/2011 | Watanabe | G06F 1/203 |
| | | | 361/695 |
| 2012/0099261 A1* | 4/2012 | Reber | G06F 1/1632 |
| | | | 361/679.3 |
| 2013/0286590 A1* | 10/2013 | Iwata | G06F 1/203 |
| | | | 361/697 |
| 2013/0327507 A1* | 12/2013 | Degner | G06F 1/203 |
| | | | 165/120 |
| 2013/0329357 A1* | 12/2013 | Degner | H05K 5/02 |
| | | | 361/679.47 |
| 2014/0092559 A1* | 4/2014 | Yamaguchi | H05K 7/20336 |
| | | | 361/700 |
| 2014/0160671 A1* | 6/2014 | Yang | G06F 1/203 |
| | | | 361/679.47 |
| 2014/0182818 A1* | 7/2014 | Wang | H01L 23/427 |
| | | | 165/104.21 |
| 2014/0218864 A1* | 8/2014 | Wong | G06F 1/203 |
| | | | 361/697 |
| 2014/0290918 A1* | 10/2014 | Chen | G06F 1/203 |
| | | | 165/121 |
| 2015/0061478 A1* | 3/2015 | Honda | G06F 1/20 |
| | | | 312/236 |
| 2016/0003261 A1* | 1/2016 | Tamaoka | F04D 25/0613 |
| | | | 415/177 |

* cited by examiner

STORAGE DEVICE COOLING UTILIZING A REMOVABLE HEAT PIPE

FIELD

This disclosure relates generally to cooling within an Information Handling System (IHS), and more specifically, to heat pipe cooling within an IHS.

BACKGROUND

As the value and use of information continues to increase, individuals and businesses seek additional ways to process and store information. An option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

A wide variety of IHSs are now mobile IHSs. Due to their mobility, mobile IHSs may be used in a wide variety of physical environments. The continuing integration of computers, such as mobile IHSs, into an increasing number and variety of workplace and recreational settings results in mobile IHSs being used in harsh outdoor conditions, as well as various commercial and industrial settings that may subject the mobile IHS to heavy use, various contaminants and harsh environments. In addition, the manner of use of mobile IHSs in such conditions results in a high chance a mobile IHS may be dropped or otherwise subjected to violent physical forces. Providing durability for such rugged IHSs adapted to functioning reliably in extreme conditions requires a variety of specialized design features designed to protect the rugged IHS from the physical environment. For instance, the enclosure of such rugged IHSs may be sealed such that the enclosure is dust tight and water tight, thus protecting the internal components of the IHS from contaminants and water, and in some cases pressurized water.

Components of an IHS consume electrical power and can generate significant amounts of heat. Heat within an IHS may degrade the reliability and performance of various internal components of the IHS, possibly resulting in costly malfunctions and component failures. In order to ventilate heated air out of the IHS and away from internal components, an IHS may utilize a cooling fan. For IHSs that are not designed for rugged use, cooling fans can draw ambient air directly into the internal compartments of the IHS in order to ventilate heated air away from heat dissipating components installed within these internal compartments of the IHS. In a rugged IHS, the heat-generating electrical components may be installed within a sealed internal compartment of the IHS that is physically isolated from an ambient air source. The inability to utilize forced ambient air cooling within such sealed internal compartments of rugged IHSs significantly restricts the cooling capacity of rugged IHSs.

SUMMARY

In various embodiments, a cooling system for providing cooling to a storage device installed in a sealed compartment of an IHS (Information Handling System) includes: a heat pipe extending between the storage device at a first end of the heat pipe and a fan housing at a second end of the heat pipe; a plurality of fan housing clips joined to the second end of the heat pipe, wherein the fan housing clips secure the second end of the heat pipe to an outer surface of a fan housing that seals a cooling fan in a physically isolated compartment from the sealed compartment; and a cooling plate joined to the first end of the heat pipe, where the cooling plate secures the heat pipe to a first surface of the storage device.

In various additional cooling system embodiments, the heat pipe is removably secured to the outer surface of the fan housing. In various additional cooling system embodiments, the cooling plate is removably secured to the storage device. In various additional cooling system embodiments, a size of the cooling plate corresponds to a size of the first surface of the storage device. In various additional cooling system embodiments, the outer surface of the fan housing comprises a plurality of threaded screw holes corresponding to the plurality of fan housing clips, and wherein the heat pipe is removably secured to the outer surface of the fan housing by installing a plurality of screws in the corresponding fan housing clips and threaded screw holes. In various additional cooling system embodiments, the storage devices is a solid-state drive installed in a drive bay within the sealed compartment. In various additional cooling system embodiments, the drive bay comprises a plurality of threaded screw holes corresponding a plurality of clips on the cooling plate, and wherein the heat pipe is removably secured to the storage device by installing a plurality of screws in the corresponding cooling plate clips and drive bay screw holes.

In various additional embodiments, an IHS includes: a storage device installed in a sealed compartment of the IHS; a fan housing that seals a cooling fan in a physically isolated compartment from the sealed compartment; a heat pipe extending between the storage device at a first end of the heat pipe and the fan housing at a second end of the heat pipe; a plurality of fan housing clips joined to the second end of the heat pipe, wherein the fan housing clips secure the second end of the heat pipe to an outer surface of the fan housing; and a cooling plate joined to the first end of the heat pipe, wherein the cooling plate secures the heat pipe to a first surface of the storage device.

In various additional IHS embodiments, the heat pipe is removably secured to the outer surface of the fan housing. In various additional IHS embodiments, the cooling plate is removably secured to the storage device. In various additional IHS embodiments, a size of the cooling plate corresponds to a size of the first surface of the storage device. In various additional IHS embodiments, the outer surface of the fan housing comprises a plurality of threaded screw holes corresponding to the plurality of fan housing clips, and wherein the heat pipe is removably secured to the outer surface of the fan housing by installing a plurality of screws in the corresponding fan housing clips and threaded screw holes. In various additional IHS embodiments, the storage devices is a solid-state drive installed in a drive bay within the sealed compartment. In various additional IHS embodiments, the drive bay comprises a plurality of threaded screw holes corresponding a plurality of clips on the cooling plate, and wherein the heat pipe is removably secured to the storage device by installing a plurality of screws in the corresponding cooling plate clips and drive bay screw holes.

In various additional embodiments, a heat pipe provides cooling to a storage device installed in a sealed compartment of an IHS, wherein the heat pipe extends between the storage device at a first end of the heat pipe and a fan housing at a second end of the heat pipe. The heat pipe includes: a plurality of fan housing clips joined to the second end of the heat pipe, wherein the fan housing clips secure the second end of the heat pipe to an outer surface of a fan housing that seals a cooling fan in a physically isolated compartment from the sealed compartment; and a cooling plate joined to the first end of the heat pipe, wherein the cooling plate secures the heat pipe to a first surface of the storage device.

In various additional heat pipe embodiments, the heat pipe is removably secured to the outer surface of the fan housing. In various additional heat pipe embodiments, the cooling plate is removably secured to the storage device. In various additional heat pipe embodiments, a size of the cooling plate corresponds to a size of the first surface of the storage device. In various additional heat pipe embodiments, the outer surface of the fan housing comprises a plurality of threaded screw holes corresponding to the plurality of fan housing clips, and wherein the heat pipe is removably secured to the outer surface of the fan housing by installing a plurality of screws in the corresponding fan housing clips and threaded screw holes. In various additional heat pipe embodiments, the storage device is installed in a drive bay comprising a plurality of threaded screw holes corresponding a plurality of clips on the cooling plate, and wherein the heat pipe is removably secured to the storage device by installing a plurality of screws in the corresponding cooling plate clips and drive bay screw holes.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

For purposes of this disclosure, an Information Handling System (IHS) may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network storage device, a network router, a network video camera, a data recording device used to record physical measurements in a manufacturing environment, or any other suitable device and may vary in size, shape, performance, functionality, and price. The IHS may include memory, one or more processing resources, e.g., a central processing unit (CPU) or hardware or software control logic. Additional components or the IHS may include one or more storage devices, one or more communications ports for communicating with external devices as well as various input and output (I/O) devices, e.g., a keyboard, a mouse, and a video display. The IHS may also include one or more buses operable to transmit communication between the various hardware components.

Figure 1:
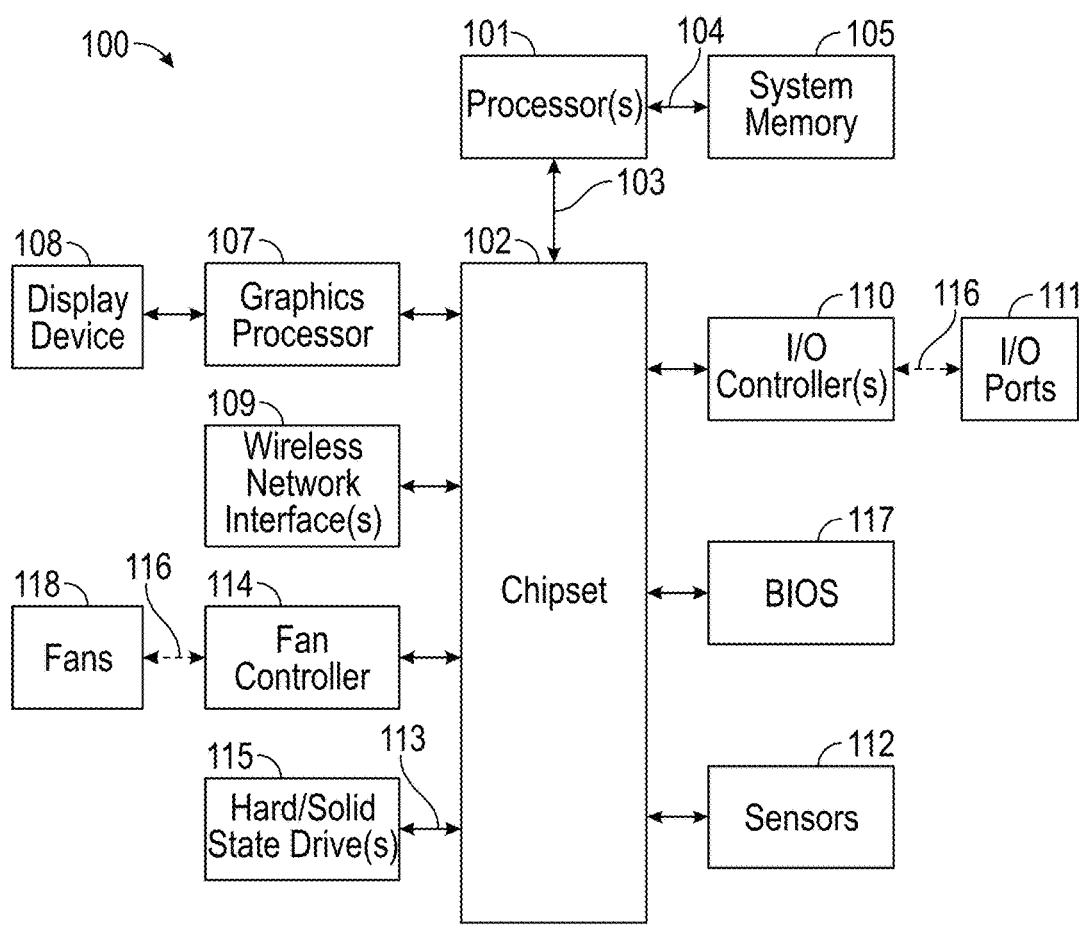
FIG. 1 is a block diagram depicting certain components of an IHS configured according to various embodiments.

FIG. 1 is a block diagram of an IHS 100 configured according to certain embodiments for operation with a sealed cooling system such as may be utilized by a rugged IHS adapted for use in harsh outdoor conditions. IHS 100 may include one or more processors 101. In various embodiments, IHS 100 may be a single-processor system or a multi-processor system including two or more processors 101. Processor(s) 101 may include any processor capable of executing program instructions, such as an Intel Pentium™ series processor or any general-purpose or embedded processors implementing any of a variety of Instruction Set Architectures (ISAs). IHS 100 includes a system memory 105 that is coupled to processor 101 via a memory bus 104. System memory 105 provides processor 101 with a high speed memory that may be used in the execution of computer program instructions by the processor 101. Accordingly, system memory 105 may include one or more memory modules, such as SDRAM (Synchronous Dynamic Random-Access Memory), suitable for supporting high-speed memory operations by the processor 101.

IHS 100 includes a chipset 102 that may include one or more integrated circuits that are connect to processor 101. In certain embodiments, the chipset 102 may utilize a QPI (QuickPath Interconnect) bus 103 for communicating with the processor 101. In the embodiment of FIG. 1, chipset 102 is depicted as a separate component from processor 101. In other embodiments, all of chipset 102, or portions of chipset 102 may be implemented directly within the integrated circuitry of the processor 101. Chipset 102 provides the processor 101 with access to a variety of resources provided by peripheral components that are coupled to IHS 100.

Chipset 102 may provide access to a graphics processor 107. In certain embodiments, graphics processor 107 may be comprised within one or more video or graphics cards that have been installed on IHS 100. Graphics processor 107 may be coupled to the chipset 102 via a graphics bus such as provided an AGP (Accelerated Graphics Port) bus or a PCI (Peripheral Component Interconnect or) bus. In certain embodiments, graphics processor 107 generates display signals and provides them to a coupled display device 108. In certain embodiments, chipset 102 may also support one or more wireless network interfaces 109 that support various types of wireless connections, such as a provided via W-Fi and/or Bluetooth controllers.

In certain embodiments, chipset 102 may also provide access to various external devices and/or networks via one or more I/O ports 111 that are supported by one or more I/O controllers 110. The one or more I/O ports 111 may conform to various form factors and may be implemented using a variety of physical interfaces that may be used to connect a wide variety of external devices to the IHS 100, such as user input devices, peripheral devices, external displays, external storage devices and removable storage devices. In addition, the one or more I/O ports 111 may include communication ports that support various types of wired network connections. As described, a rugged IHS may be implemented utilizing a sealed enclosure. In IHS 100, the one or more external facing I/O ports 111 are physically isolated from the I/O controllers 110 by a seal 116 that encloses and protects the internal compartments of the IHS.

Another resource that may be accessed by processor 101 via chipset 102 is BIOS 117. The BIOS 117 provides an abstraction layer for interfacing with certain hardware components that are utilized by IHS 100. Via this hardware abstraction layer provided by BIOS 117, the software executed by the processor 101 of IHS is able to interface with certain I/O devices that are coupled to the IHS 100. The Unified Extensible Firmware Interface (UEFI) was designed as a successor to BIOS. As a result, many modern IHSs utilize UEFI in addition to or instead of a BIOS. As used herein, BIOS is intended to also encompass UEFI. Upon booting of the IHS 100, processor 101 may utilize BIOS 117 instructions to initialize and test hardware components coupled to the IHS and to load an Operating System (OS) for use by the IHS 100.

Chipset 102 also provides access to one or more internal storage devices 115. In certain embodiments, the internal storage devices 115 of IHS 100 may include a solid-state drive (SSD) or other storage device suitable for use in a mobile IHS such as a rugged IHS. In embodiments utilizing an SSD storage device, the SSD may be accessed by the chipset 102 using a logical device interface, such as NVMe (Non-Volatile Memory Express), via a PCIe (Peripheral Component Interconnect Express) bus 113 connection, thus supporting a high-speed bus connection to the internal storage device(s) 115. Other embodiments may utilize various other types of storage technologies for the one or more internal storage devices 115 of IHS 100. The internal storage devices 100 may be mounted in various locations within the sealed enclosure of IHS 100, and is thus protected within the sealed enclosure of IHS 100.

In the illustrated embodiment, the chipset 102 also provides access to a fan controller 114 that may be used to operate an airflow cooling system that includes one or more cooling fans 118. The fan controller 114 may be configured to interoperate with one or more environmental sensors 112 in order to monitor temperature conditions at one or more internal locations within the IHS 100 and to operate the cooling fans 118 accordingly. In certain embodiments, the fan controller 114 may be an embedded microcontroller on the motherboard of the IHS 100. In other embodiments, the fan controller 114 may be a stand-alone integrated circuit board that is installed within an internal compartment of the IHS 100. The fan controller 114 may be physically isolated from the cooling fans 118 by the seal 116 that encloses and protects the internal components of the IHS. This physical isolation of the fans 118 by seal 116 prevents the fans from directly ventilating heated air from within sealed internal compartment of IHS 100.

Not all IHSs 100 include each of the components shown in FIG. 1, and other components not shown may exist. Furthermore, some components shown as separate may exist in an integrated package or be integrated in a common integrated circuit with other components. For example, various of the resources provided via chipset 102 may instead be integrated into the one or more processor(s) 101 as a system-on-a-chip.

Figure 2:
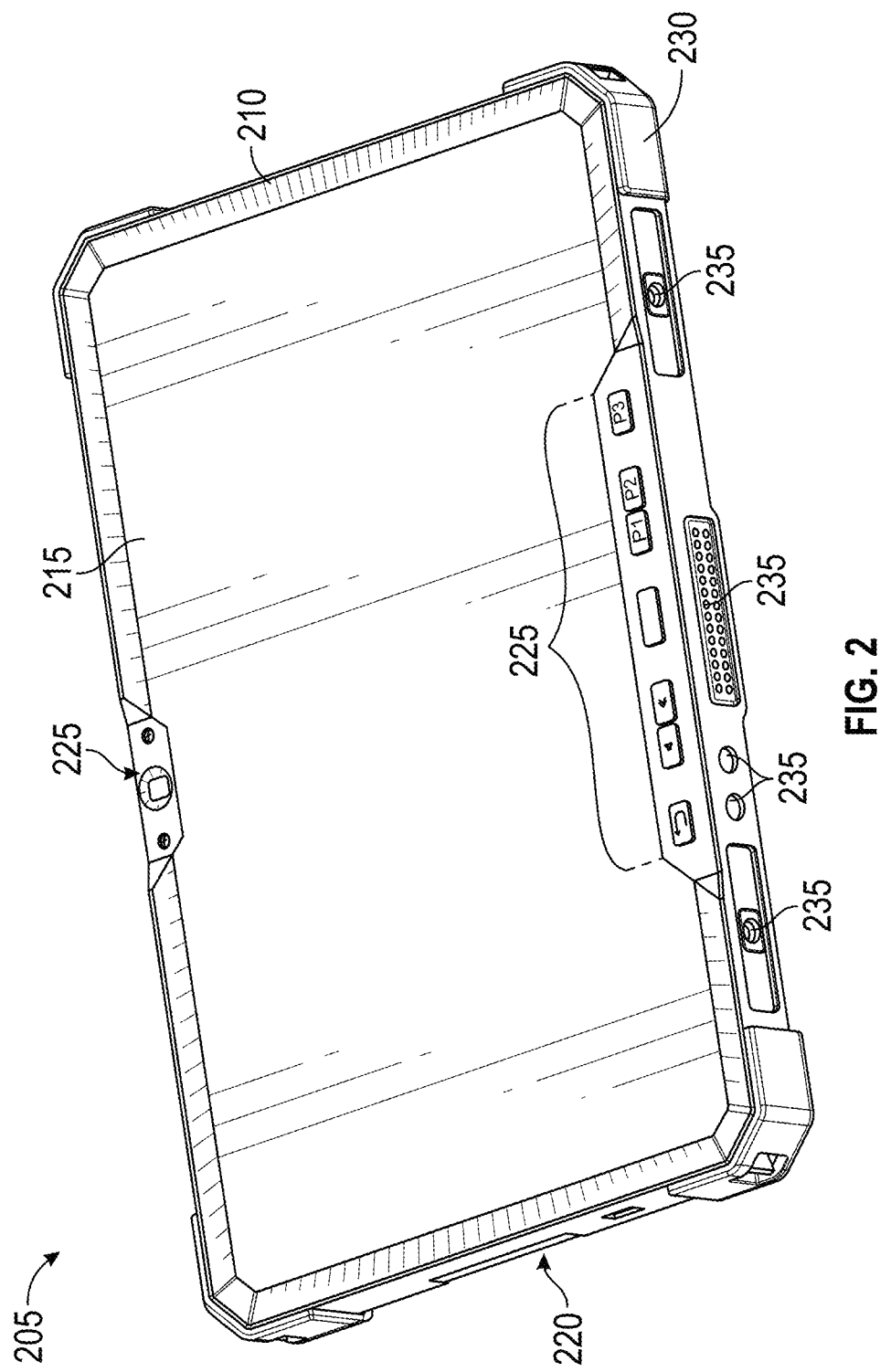
FIG. 2 is an illustration depicting the front face of a rugged tablet.

FIG. 2 is an illustration depicting certain aspects of the front face and sides of a rugged tablet 205. The rugged tablet 205 includes various features that protect the tablet from environmental conditions and from physical forces. The rugged tablet may include a touch screen display 215 that may receive user inputs via finger gestures and/or via the use of a stylus. The touch screen 215 may be constructed from an impact resistant material and may be especially adapted for outdoor use. The edges of touch screen 215 may be sealed within the enclosure 210 of the rugged tablet 205. As described, a mobile IHS adapted for use in outdoor conditions such as rugged tablet 205 may be constructed using an enclosure 210 that seals the internal compartments of the IHS and protects electronic components installed within these internal components from environmental conditions and contaminants.

As illustrated, sealed enclosure 210 of the rugged tablet 205 may utilize protective elements such as corner protector 230 that may be installed on each corner of the rugged tablet 205 and protect the tablet from damage due to drops and other such physical events. The rugged tablet 205 may utilize various additional types of protective elements that may be located at various points along the other edges of the tablet. The rugged tablet 205 may also include various control buttons 225 that may be configured in various arrangements and which allow the user to operate the tablet. In the illustrated rugged tablet 205, a set of control buttons 225 are incorporated into the front face of the enclosure 210. Other rugged tablets may include various different types of control buttons and user input mechanisms at other locations, such as along the sides of the enclosure of the rugged tablet.

As described with respect to FIG. 1, a rugged IHS may include various external-facing, physical I/O ports that allow the IHS to be connected to various devices and/or networks. The rugged tablet 205 of FIG. 2 includes various I/O ports 235 along the lower edge of the tablet. Also as described with respect to FIG. 1, the I/O ports 235 may be physically isolated from the sealed internal compartment of the rugged tablet 205. The rugged tablet 205 may also include an air inlet 220 that may be used by the cooling system of the rugged tablet 205 to draw in ambient air that may be circulated by a cooling fan located within an internal fan compartment of the tablet. However, as described with respect to FIG. 1, the airflow cooling system utilizing that ambient air vent 220 may be physically isolated from the sealed internal compartment of the rugged tablet 205.

Figure 3:
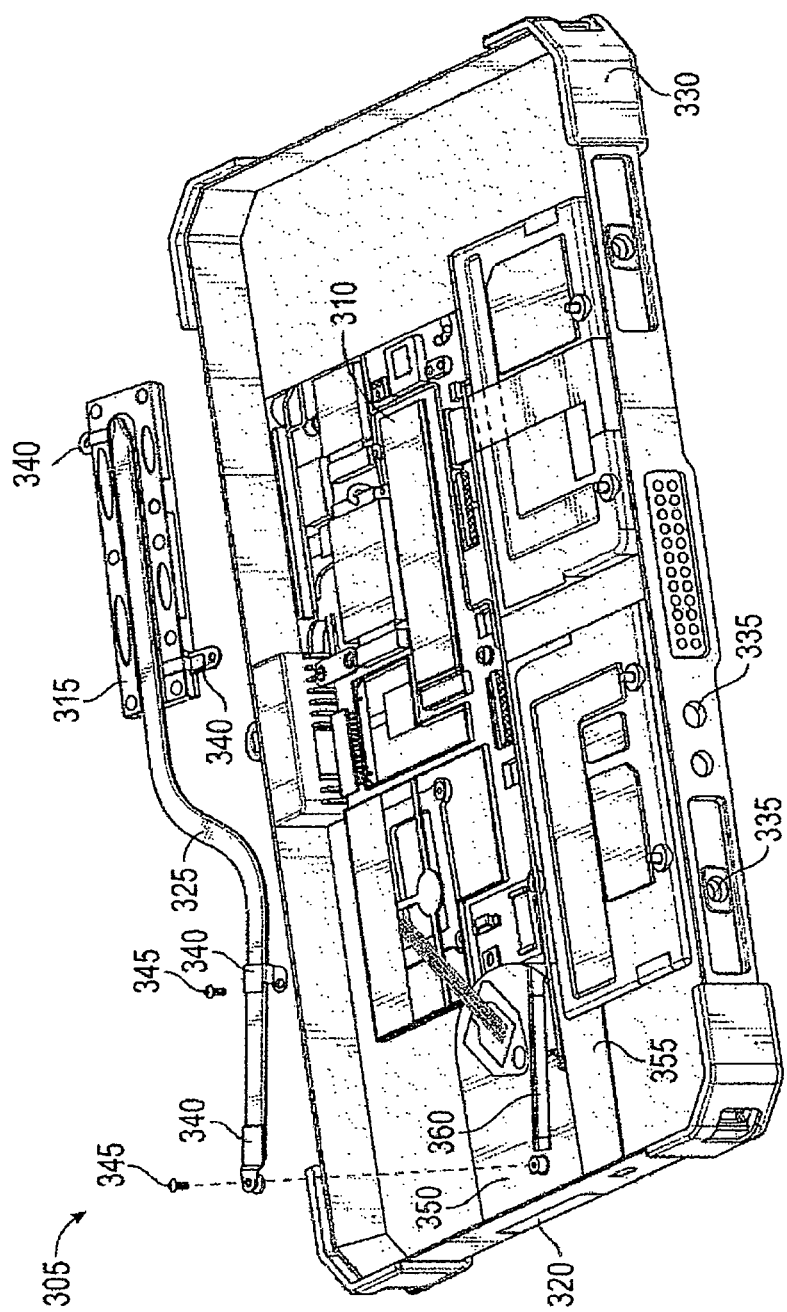
FIG. 3 is an illustration depicting certain internal components of a rugged tablet, including an uninstalled heat pipe cooling system according to various embodiments.

FIG. 3 is an illustration depicting certain internal components of a rugged tablet 305 similar to the fully enclosed rugged tablet 205 that is described with respect to FIG. 2. In FIG. 3, the display portion of the rugged tablet 305 has been removed to reveal certain components installed within a sealed internal compartment of the tablet. FIG. 3 illustrates certain components of a heat pipe cooling system according to various embodiments that may be used to transfer heat from within the sealed internal compartment of the rugged tablet 305. In particular, the heat pipe cooling system according to various embodiments may be utilized to transfer heat directly from a storage device 310 installed within the sealed internal compartment of the rugged tablet. In particular, the heat pipe cooling system may be utilized to transfer heat directly from storage device 310 to the outer surface of a fan compartment 350 that physically isolates an airflow cooling system from the sealed internal compartment of the rugged table 305.

As described with respect to FIGS. 1 and 2, a rugged tablet 305 may be especially adapted for operation in outdoor conditions and for protecting the internal electrical components of the tablet from contaminants, water and physical forces. For instance, the corners of the enclosure of the rugged tablet 305 may utilize protective covers 330. In addition, the various external-facing I/O ports 335 of the rugged tablet 305 may be physically isolated from the sealed internal compartment of the rugged tablet. As described, the sealed internal compartment of the rugged tablet 305 may also be physically isolated from an airflow cooling system that provides forced air cooling by drawing ambient air via air inlet 320.

In FIG. 3, the airflow cooling system of rugged tablet 305 includes a cooling fan housed within a fan compartment that physically isolates the cooling fan from the sealed internal compartment of the rugged tablet. In the illustrated embodiment, the fan compartment of rugged tablet 305 is formed from a sidewall 355 and a fan cover 350. In the illustrated rugged tablet 305, the sidewall 355 portion of the fan compartment is formed in a U-shaped configuration, with the open end of the sidewall 355 interfacing with the left side of the enclosure of the tablet and allowing the cooling fan to draw ambient air via air inlet 320. The construction, location and arrangement of the fan compartment within rugged tablet 305 may vary in different embodiments of the heat pipe cooling system.

The cooling fan housed within the fan compartment that is formed from the sidewall 355 and the fan cover 350 draws ambient air via air inlet 320 located on the left side of the enclosure of the rugged tablet 305. The fan compartment of the rugged table 305 physically isolates the airflow cooling system housed within the fan compartment from the sealed internal compartment such that the forced airflow of the airflow cooling system cannot be used to directly ventilate heated air from within the sealed internal compartment of the rugged table 305. Sealing of the fan compartment in this manner may be provided by forming the fan compartment from sidewall 355 and fan cover 350 elements that are constructed and assembled to form a dust tight and water tight seal that physically isolates the cooling fan from the sealed internal compartment of the rugged tablet 305.

As described, this physical isolation of the airflow cooling system limits the ability of the airflow cooling system to ventilate heated air from within the internal compartment of an IHS such as rugged tablet 305. Due in part to these limitations on utilizing ambient airflow cooling in a rugged IHS, cooling the internal compartment of a rugged IHS is particularly challenging. As in other types of IHSs, supporting certain upgraded hardware in a rugged IHS may result in the generation of additional heat that must be dissipated or otherwise displaced from within the IHS. In light of these restrictive limitations on cooling a sealed internal compartment of a rugged IHS, such as rugged tablet 305, providing support for any additional amount of cooling within a rugged IHS may be difficult.

Also illustrated in FIG. 3 is a storage device 310 installed within the sealed internal compartment of the rugged laptop 305. In certain embodiments, the storage device 310 may be a solid-state drive (SSD) suitable for use in a mobile IHS, such as rugged tablet 305. The performance advantages of SSDs result in a significant amount of heat being generated by this type of storage device. In certain embodiments, the storage device 310 may be a SSD that utilizes a high-speed logical device interface, such as NVMe (Non-Volatile Memory Express). The high-speed supported by such bus interfaces results in faster storage device operations, and may thus also result greater amounts of heat being generated by the storage device. Accordingly, supporting upgraded storage drives in a rugged IHS may be significantly constrained by the ability to provide adequate cooling for the upgraded storage device.

FIG. 3 also illustrates a heat pipe 325 in an uninstalled configuration above the internal compartment of rugged laptop 305. As illustrated, heat pipe 325 includes a cooling plate 315 that is joined along the length of one end of the heat pipe 325. In certain embodiments, the cooling plate 315 may be permanently joined to the heat pipe 325 in a manner that promotes the transfer of heat directly from the cooling plate 315 to the heat pipe 325. The cooling plate 315 may take on various shapes other than the rectangular shape of the cooling plate 315 in the illustrated embodiment. The shape of the cooling plate 315 may be selected to correspond to the dimensions of the storage device 310. The storage device 310 may be installed in any location within the internal compartment of the rugged tablet 305. The size and shape of the heat pipe 325 may be selected in various embodiments to extend to the location of the storage device 310 within the sealed internal compartment. In certain embodiments, the storage device 310 may be installed in a drive bay located within the internal compartment. The drive bay may allow the storage device 310 to be uninstalled and re-installed or replaced in the drive bay by a compatible storage device 310 that is supported by the rugged tablet 305. In certain embodiments the cooling plate 315 may include one or more clips 340 that receive screws and allow the cooling plate to be secured directly against a surface of the installed storage device 310.

As illustrated, the end of the heat pipe 325 opposite the cooling plate 315 includes two clips 340. The clips 340 may be attached at locations along the heat pipe 325 corresponding to threaded screw holes provided by the fan cover 350. In certain embodiments, the fan cover clips 340 are permanently joined to the heat pipe 325 at locations corresponding to the threaded screw holes provided by fan cover 350. Various embodiments of the heat pipe may utilize different numbers and arrangements of fan cover clips along the heat pipe. The fan cover clips 340 may be used to secure the heat pipe 325 to the fan cover 350 by installing screws 345 through the fan cover clips 340 and into the threaded screw holes provided by the fan cover 350. In certain embodiments, the fan cover 350 may include a channel 360 configured to securely receive a portion of the installed heat pipe 325 as it rests on the fan cover 350. The channel 360 provided by the fan cover 350 may accommodate various different portions of the heat pipe 325 in various embodiments.

Figure 4:
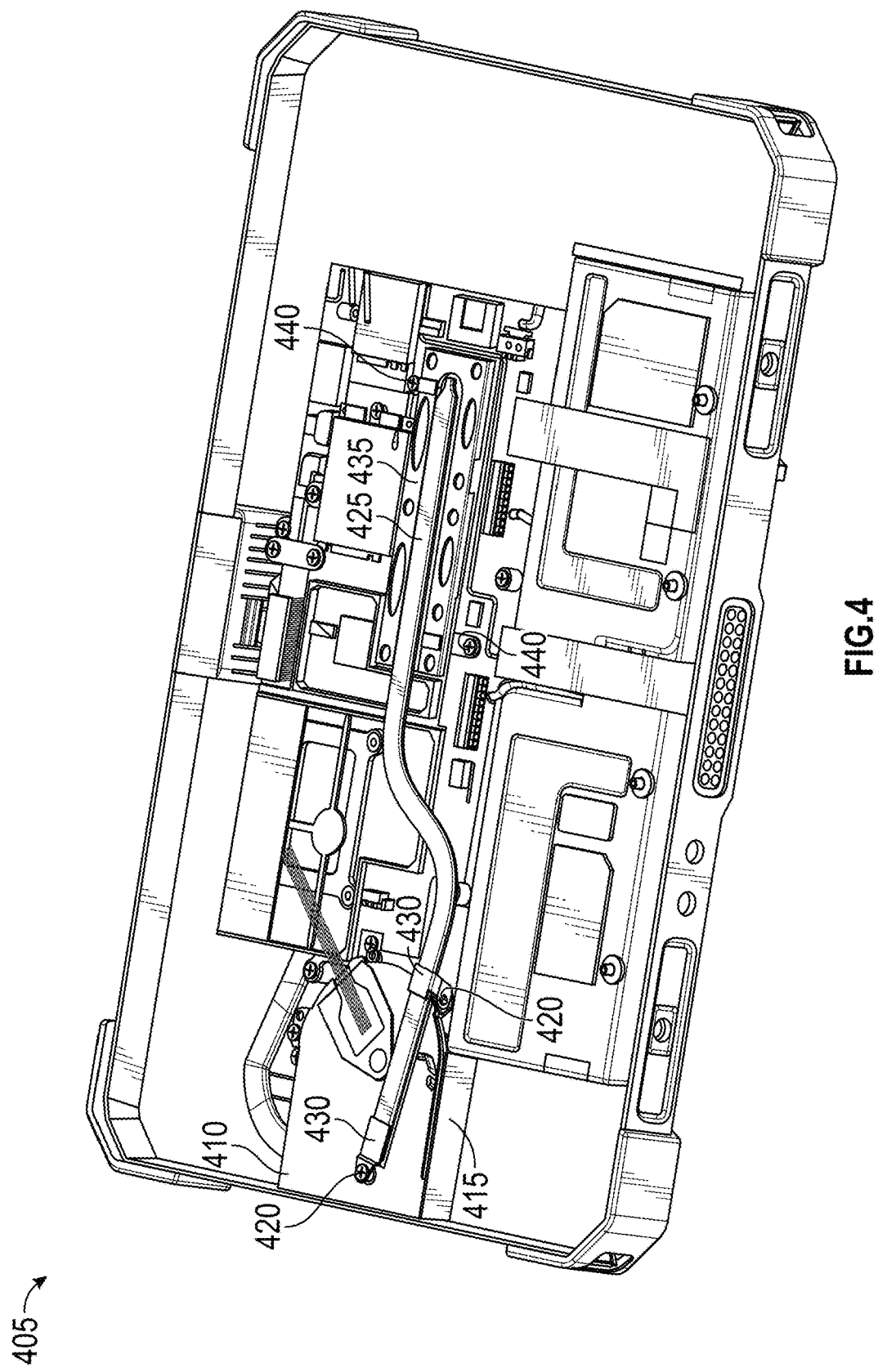
FIG. 4 is an illustration depicting certain internal components of a rugged tablet, including an installed heat pipe cooling system according to various embodiments.

FIG. 4 is an illustration depicting certain internal components of a rugged tablet 405 similar to the fully enclosed rugged tablet 205 that is illustrated in FIG. 2 and the rugged tablet 305 of FIG. 3. As illustrated in FIG. 4, the heat pipe cooling system is installed within the sealed internal compartment of the rugged tablet 405, with the cooling plate 435 now obscuring the storage device. Also as illustrated, the heat pipe 425 may be secured to both the fan cover 410 and the storage device of the rugged tablet 405. On one end of the heat pipe 425, the cooling plate 435 may be secured against a surface of the storage device. In certain embodiments, the cooling plate 435 may be secured against a surface of the storage device using screws 440 that are inserted in the clips provided by the cooling plate 435 and fastened within threaded screw holes provided within the internal compartment of the rugged tablet 405. In certain embodiments, the threaded screw holes that are used to secure cooling plate 435 against a surface of the storage device may be provided by the drive bay housing in which storage device is installed.

As illustrated in FIG. 4, the other end of the heat pipe 425 may be secured to the fan cover 410 portion of the fan housing that physically isolates the forced air cooling system from the sealed internal compartment of the rugged tablet 405. The heat pipe 425 may be secured to various other outer surfaces of the fan housing in various additional embodiments, such as a sidewall 415 of the fan housing. In the illustrated embodiment, the heat pipe 425 is secured to the fan cover 410 using screws 420 that are inserted into the fan cover clips and installed within threaded screw holes provided by the fan cover 410. The threaded screw holes utilized to secure the heat pipe 425 to the outer surface of the fan compartment may be provided and arranged in various surfaces of the housing that forms the sealed fan compartment in various embodiments. The threaded screw holes provided by fan cover 410 may correspond to the alignment clips 430 of the heat pipe 425 such that the installed heat pipe 425 may rest within a channel provided by the fan cover 410. The size and dimensions of the heat pipe channel in the fan cover 410 may be determined in order to maximize surface area contact between the fan cover 410 and the installed heat pipe 425.

Installed in this manner, the heat pipe cooling system provides a mechanism for transferring heat directly from the storage device to the outer surface of the compartment of the airflow cooling system that is physically isolated from the sealed internal compartment in which the storage devices installed. Heat that is dissipated by the storage device may be absorbed by the cooling plate 435 and transferred by the heat pipe 425 to the housing of the fan compartment, where the heat may be absorbed by the fan housing and subsequently dissipated into the sealed fan compartment of the physically isolated airflow cooling system. In this manner, the airflow cooling system may draw in ambient air to ventilate heat from within the sealed fan compartment as heat is transferred by the heat pipe 425 from the storage device to the outer surface of the fan housing.

Figure 5:
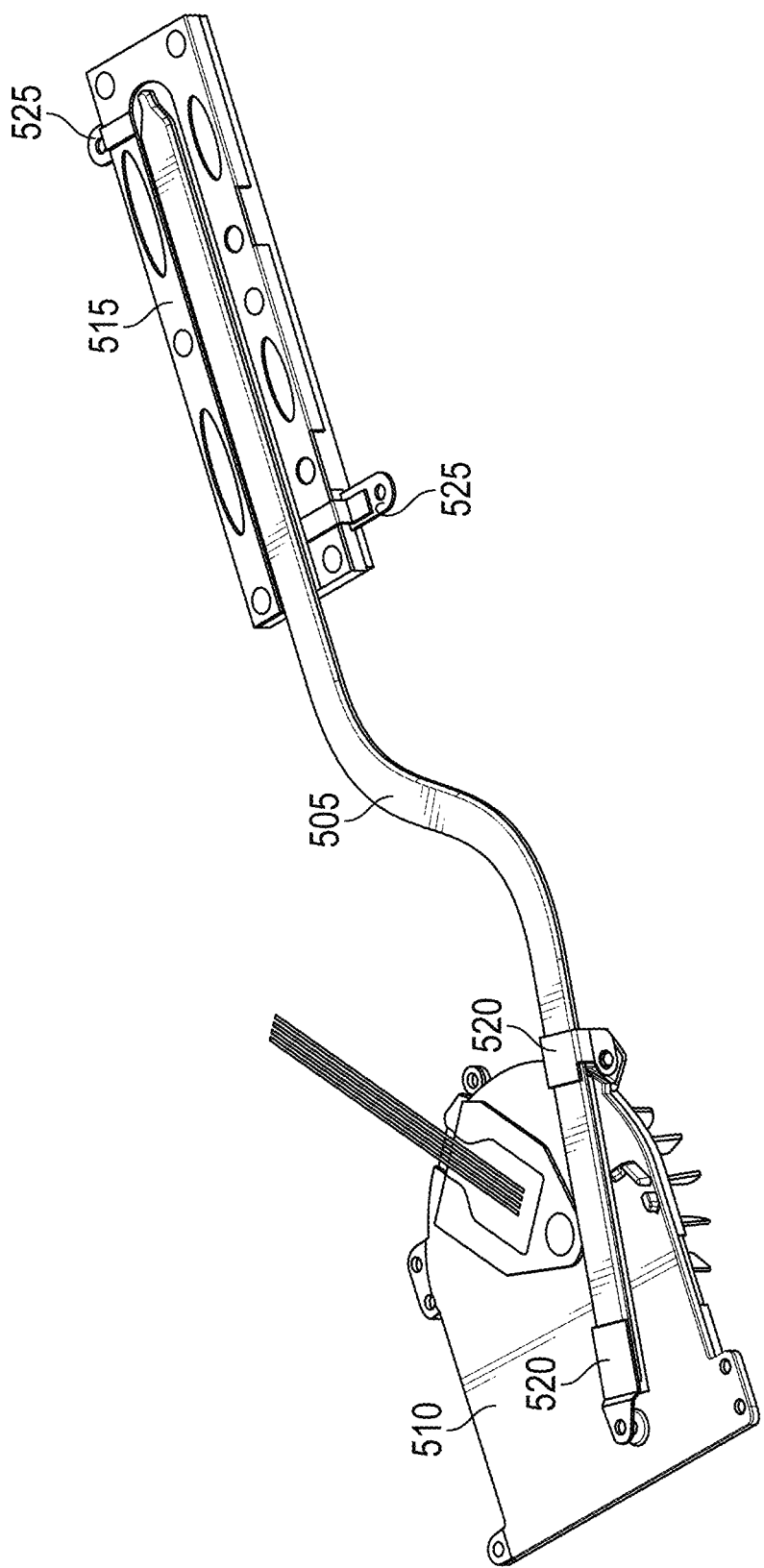
FIG. 5 is an illustration depicting certain components of a heat pipe cooling system according to various embodiments.

FIG. 5 is an illustration depicting certain components of a heat pipe cooling system according to various embodiments. In FIG. 5, the heat pipe 505 is shown secured to the fan cover 510. As described with regard to the prior embodiments, the heat pipe 505 may be secured to the fan cover 510 via screws that are inserted into fan cover clips 520 and installed within threaded screw holes provided by the fan cover 510. Also illustrated in FIG. 5 are the clips 525 that receive screws that are used to secure the cooling plate 515 against a surface of a storage device, thus promoting the ability of the cooling plate 515 to absorb heat dissipated by the storage device.

By providing the ability to remove the heat pipe cooling system, technicians can access the storage device that is being cooled by the heat pipe cooling system. As with any component of an IHS, a storage device may fail or otherwise require replacement. In addition, storage device may be replaced with an upgraded storage device. In certain scenarios, access to a storage device used within an IHS such as a rugged IHS may be closely guarded such that the storage device is preferably removed from the IHS if repairs to the IHS require relinquishing control of the IHS. The ability to install and uninstall the heat pipe cooling system allows the described cooling to be provided to the storage device, while still preserving the ability to access and remove the storage device.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Also for purposes of this disclosure, computer-readable media may include any instrumentality or aggregation of instrumentalities that may retain data and/or instructions for a period of time. Computer-readable media may include, without limitation, storage media, e.g., a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory. Computer-readable media may also include optically readable barcodes (one or two-dimensional), plastic cards with embedded magnetic stripes, mechanically or optically read punched cards, or radio frequency identification tags.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A cooling system for providing cooling to a storage device installed in a sealed compartment of an Information Handling System (IHS), the cooling system comprising:
 a heat pipe extending between the storage device at a first end of the heat pipe and a fan housing at a second end of the heat pipe, wherein the fan housing comprises a fan cover plate and a side wall that physically isolate a cooling fan from the sealed compartment;
 a plurality of fan housing clips coupled to the second end of the heat pipe, wherein the fan housing clips secure the second end of the heat pipe to the fan cover plate, wherein the fan cover plate comprises a channel manufactured thereon and configured to transfer heat from the heat pipe to the fan cover plate, and wherein the fan cover plate is configured to dissipate the heat from the heat pipe; and
 a cooling plate joined to the first end of the heat pipe, wherein the cooling plate secures the heat pipe to a first surface of the storage device.

2. The cooling system of claim 1, wherein the heat pipe is removably secured to an edge of the fan cover plate at a location where the channel terminates.

3. The cooling system of claim 1, wherein the cooling plate is removably secured to the storage device.

4. The cooling system of claim 1, wherein a size of the cooling plate corresponds to a size of the first surface of the storage device.

5. The cooling system of claim 2, wherein the fan cover plate comprises a plurality of threaded screw holes corresponding to the plurality of fan housing clips, and wherein the heat pipe is removably secured to the fan cover plate by installing a plurality of screws in the corresponding fan housing clips and threaded screw holes.

6. The cooling system of claim 1, wherein the storage device is a solid-state drive installed in a drive bay within the sealed compartment.

7. The cooling system of claim 6, wherein the drive bay comprises a plurality of threaded screw holes corresponding a plurality of clips on the cooling plate, and wherein the heat pipe is removably secured to the storage device by installing a plurality of screws in the corresponding cooling plate clips and drive bay screw holes.

8. An Information Handling System (IHS) comprising:
 a storage device installed in a sealed compartment of the IHS;
 a fan housing that seals a cooling fan in a physically isolated compartment from the sealed compartment, wherein the fan housing comprises a fan cover plate;
 a heat pipe extending between the storage device at a first end of the heat pipe and the fan housing at a second end of the heat pipe, wherein the fan cover plate comprises a channel manufactured thereon and configured to transfer heat from the heat pipe to the fan cover plate, and wherein the fan cover plate is configured to dissipate the heat from the heat pipe;
 a plurality of fan housing clips joined to the second end of the heat pipe, wherein the fan housing clips secure the second end of the heat pipe to an outer surface of the fan housing; and
 a cooling plate joined to the first end of the heat pipe, wherein the cooling plate secures the heat pipe to a first surface of the storage device.

9. The IHS of claim 8, wherein the heat pipe is removably secured to an edge of the fan cover plate at a location where the channel terminates.

10. The IHS of claim 8, wherein the cooling plate is removably secured to the storage device.

11. The IHS of claim 8, wherein a size of the cooling plate corresponds to a size of the first surface of the storage device.

12. The IHS of claim 9, wherein the fan cover plate comprises a plurality of threaded screw holes corresponding to the plurality of fan housing clips, and wherein the heat pipe is removably secured to the fan cover plate by installing a plurality of screws in the corresponding fan housing clips and threaded screw holes.

13. The IHS of claim 8, wherein the storage device is a solid-state drive installed in a drive bay within the sealed compartment.

14. The IHS of claim 13, wherein the drive bay comprises a plurality of threaded screw holes corresponding a plurality of clips on the cooling plate, and wherein the heat pipe is removably secured to the storage device by installing a plurality of screws in the corresponding cooling plate clips and drive bay screw holes.

15. A heat pipe for providing cooling to a storage device installed in a sealed compartment of an Information Handling System (IHS), wherein the heat pipe extends between the storage device at a first end of the heat pipe and a fan housing at a second end of the heat pipe, and wherein the heat pipe comprises:
 a plurality of fan housing clips joined to the second end of the heat pipe, wherein the fan housing clips secure the second end of the heat pipe to an outer surface of a fan housing that seals a cooling fan in a physically isolated compartment from the sealed compartment, wherein the fan housing comprises a fan cover plate, wherein the fan cover plate comprises a channel manufactured thereon and configured to transfer heat from the heat pipe to the fan cover plate, and wherein the fan cover plate is configured to dissipate the heat from the heat pipe; and
 a cooling plate joined to the first end of the heat pipe, wherein the cooling plate secures the heat pipe to a first surface of the storage device.

16. The heat pipe of claim 15, wherein the heat pipe is removably secured to an edge of the fan cover plate at a location where the channel terminates.

17. The heat pipe of claim 15, wherein the cooling plate is removably secured to the storage device.

18. The heat pipe of claim 15, wherein a size of the cooling plate corresponds to a size of the first surface of the storage device.

19. The heat pipe of claim 16, wherein the fan cover plate comprises a plurality of threaded screw holes corresponding to the plurality of fan housing clips, and wherein the heat pipe is removably secured to the fan cover plate by installing a plurality of screws in the corresponding fan housing clips and threaded screw holes.

20. The heat pipe of claim 19, wherein the storage device is installed in a drive bay comprising a plurality of threaded screw holes corresponding a plurality of clips on the cooling plate, and wherein the heat pipe is removably secured to the storage device by installing a plurality of screws in the corresponding cooling plate clips and drive bay screw holes.

* * * * *